United States Patent
Carullo et al.

(10) Patent No.: US 9,606,149 B2
(45) Date of Patent: Mar. 28, 2017

(54) METHOD AND DEVICE FOR COUNTING ENERGISATION EVENTS

(71) Applicant: Schneider Electric Industries SAS, Rueil Malmaison (FR)

(72) Inventors: Rey-Anthony Carullo, Singapore (SG); Ya Chee Yeong, Singapore (SG); Yong Heng Han, Singapore (SG); Liew Yew Loung, Singapore (SG); Pan Yi Jun, Singapore (SG)

(73) Assignee: Schneider Electric Industries SAS, Rueil Malmaison (FR)

( * ) Notice: Subject to any disclaimer, the term of this patent is extended or adjusted under 35 U.S.C. 154(b) by 605 days.

(21) Appl. No.: 13/629,768

(22) Filed: Sep. 28, 2012

(65) Prior Publication Data
US 2013/0234697 A1 Sep. 12, 2013

(51) Int. Cl.
*H02H 3/00* (2006.01)
*H02H 3/08* (2006.01)
*G01R 19/00* (2006.01)
*G01R 31/327* (2006.01)

(52) U.S. Cl.
CPC .......... *G01R 19/00* (2013.01); *G01R 31/327* (2013.01)

(58) Field of Classification Search
CPC ............................ G01R 19/00; G01R 31/327
USPC ................. 324/76.11; 361/71, 93.1, 93.3
See application file for complete search history.

(56) References Cited

U.S. PATENT DOCUMENTS

| | | | |
|---|---|---|---|
| 4,958,252 A * | 9/1990 | Murphy | H01H 1/0015 361/87 |
| 6,433,978 B1 * | 8/2002 | Neiger et al. | 361/42 |
| 6,836,396 B1 * | 12/2004 | Tignor et al. | 361/93.3 |
| 2009/0184821 A1 * | 7/2009 | Kuris et al. | 340/541 |
| 2011/0241692 A1 | 10/2011 | Akita et al. | |

FOREIGN PATENT DOCUMENTS

| | | |
|---|---|---|
| CN | 101344575 A | 1/2009 |
| CN | 102207539 A | 10/2011 |
| EP | 2293426 A1 | 3/2011 |
| JP | 05266290 A | 10/1993 |
| WO | WO-2010/057364 A1 | 5/2010 |

OTHER PUBLICATIONS

Extended European Search Report Communication dated Feb. 5, 2013, including European Search Report dated Jan. 28, 2013 and European Search Opinion, in counterpart EP Application No. EP1218522, (5 pages).

(Continued)

*Primary Examiner* — Farhana Hoque
(74) *Attorney, Agent, or Firm* — Frommer Lawrence & Haug LLP (57) ABSTRACT

A method and a device for counting energization events. The device comprises a connector member for connecting to an energizable element; a sampling module coupled to the connector member, the sampling module configured to detect energization of the energizable element; a count module coupled to the sampling module, the count module configured to count a number of detected energization events of the energizable element.

20 Claims, 8 Drawing Sheets

(56) References Cited

OTHER PUBLICATIONS

First Office Action, dated Mar. 6, 2015, in counterpart Chinese Patent Application No. 201210363012.1 (with English-language Translation thereof).
Office Action, dated Nov. 4, 2015, in counterpart Chinese Patent Application No. 201210363012.1(with English-language Translation thereof).
Office Action, dated Mar. 31, 2016, in counterpart Chinese Patent Application No. 201210363012.1(with English-language Translation thereof).
Espacenet English-language Abstract of CN-102207539-A.
Espacenet English-language Abstract of CN-101344575-A.
Office Action, dated Oct. 11, 2016, in counterpart Chinese Patent Application No. 201210363012.1 (with English-language Translation thereof).

* cited by examiner

METHOD AND DEVICE FOR COUNTING ENERGISATION EVENTS

RELATED APPLICATIONS

This application is based upon and claims the benefit of priority from the corresponding Singapore Patent Application No. 201107108-1, filed Sep. 29, 2011, which is hereby incorporated by reference herein in its entirety.

TECHNICAL FIELD

The present disclosure relates broadly to a method and device for counting energisation events of an energisable element.

BACKGROUND

In the electronics industry, devices such as relays are typically used to operate machinery and circuits. Such devices typically rely on energisation or switching on/off for operations.

Suppliers of such devices typically estimate a lifetime for devices. For example, for a switching device, a supplier may estimate the number of times the switching device is switched on before it becomes overdue for replacement. This estimate is typically known as life cycle usage or the lifetime. Currently, there is no suitable device or method which can provide information or early warning to users regarding an estimated remaining life of an energisable device. This may be due to high costs involved in monitoring, for example, each and every switching of a device. There is also a lack of an efficient method or mechanism for monitoring.

The lack of knowledge on the remaining life of such a device can lead to undesirable consequences such as risk of damage to machines or equipment when users do not replace an in-use device that is overdue for replacement. The lack of knowledge can also result in users trying to use a device which has already reached its end of the life cycle usage.

In the relevant industry, users would typically use guesswork to determine when a device should be replaced due to its life cycle usage expiring. This can lead to uncertainty during maintenance. In an attempt to eliminate uncertainty, users may decide to change all energisable devices much earlier before the estimated life cycle usage is actually due. This can lead to unnecessary costs incurred by the users.

Furthermore, during machinery or circuit breakdown, without knowledge on the life cycle usage of devices, troubleshooting is typically complicated. In addition, suppliers of failure devices carrying out failure analysis do not have an effective way of determining whether each failure device has failed due to manufacturing or production errors, or whether failure is due to expiry of the life cycle usage.

The present disclosure provides various embodiments of a method and a system for counting energisation events of an energisable element to address one or more of the above, or other, disadvantages or shortcomings.

SUMMARY

In accordance with a first aspect of some embodiments of the present invention, there is provided a device for counting energisation events, the device comprising a connector member for connecting to an energisable element; a sampling module coupled to the connector member, the sampling module configured to detect energisation of the energisable element; a count module coupled to the sampling module, the count module configured to count a number of detected energisation events of the energisable element.

The device may further comprise a display module capable of displaying information relating to a usability of the energisable element based on the counted number of detected energisation events.

The display module may comprise a bistable display, wherein the information relating to a usability of the energisable element is arranged to be displayed on the bistable display.

The bistable display may be capable of displaying the information in the absence of power supply to power the display.

One energisation event may be counted based on a detection of a switch coupled to the energisable element being switched on.

The energisable element may be a coil of a relay.

The energisation of the coil may be by connection of a power supply to the coil.

The information relating to a usability of the energisable element may be based on an estimated maximum number of energisation events.

The information relating to a usability of the energisable element may be based on an estimated remaining life of the energisable element.

In accordance with a second aspect of some embodiments of the present invention, there is provided method of counting energisation events, the method comprising connecting a count device to an energisable element; detecting energisation of the energisable element; and counting a number of detected energisation events of the energisable element.

The method may further comprise displaying information relating to a usability of the energisable element based on the counted number of detected energisation events.

The method may further comprise displaying the information relating to a usability of the energisable element on a bistable display, wherein the bistable display is capable of displaying the information in the absence of power supply to power the display.

The method may comprise counting one energisation event based detecting a switch coupled to the energisable element being switched on.

The energisable element may be a coil of a relay.

The energisation of the coil may be by connecting a power supply to the coil.

The information relating to a usability of the energisable element may be based on an estimated maximum number of energisation events.

The information relating to a usability of the energisable element may be based on an estimated remaining life of the energisable element.

In accordance with a third aspect of some embodiments of the present invention, there is provided a system for counting energisation events, the system comprising an energisable element; a device for counting energisation events, the device being connected to the energisable element; the device further comprising: a sampling module configured to detect energisation of the energisable element; and a count module coupled to the sampling module, the count module being configured to count a number of detected energisation events of the energisable element.

The device may be detachably connected to the energisable element.

The device may be integrally connected to the energisable element.

The device may further comprise a display module capable of displaying information relating to a usability of the energisable element based on the counted number of detected energisation events.

The display module may further comprise a bistable display, wherein the information relating to a usability of the energisable element is arranged to be displayed on the bistable display.

The bistable display may be capable of displaying the information in the absence of power supply to power the display.

One energisation event may be counted based on a detection of a switch coupled to the energisable element being switched on.

The energisable element may be a coil of a relay.

Energisation of the coil may be provided by connecting a power supply to the coil.

The information relating to a usability of the energisable element may be based on an estimated maximum number of energisation events.

The information relating to a usability of the energisable element may be based on an estimated remaining life of the energisable element.

Throughout the specification, including the claims, the following terms take at least the meanings explicitly associated herein, unless the context dictates otherwise. The meanings identified below do not necessarily limit the terms, but merely provide illustrative examples for the terms. The phrase "an embodiment" or "one embodiment" as used herein does not necessarily refer to the same embodiment, though it may. In addition, the meaning of "a," "an," and "the" include plural references; thus, for example, "an embodiment" is not limited to a single embodiment but may refer to one or more embodiments. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

The term "relay" as used herein broadly refers to an electrically operated switch that is positioned within an electric circuit, and has an open state to interrupt current from flowing through the circuit, and a closed state to allow current to flow through the circuit.

It will be appreciated by those skilled in the art that the foregoing brief description and the following detailed description are exemplary (i.e., illustrative) and explanatory of the subject matter of the present disclosure, but are not intended to be restrictive thereof or limiting the advantages which can be achieved by the present disclosure in various implementations. Additionally, it is understood that the foregoing summary and ensuing detailed description are representative of some embodiments of the present disclosure, and are neither representative nor inclusive of all subject matter and embodiments within the scope of the present disclosure.

BRIEF DESCRIPTION OF THE DRAWINGS

Aspects, features, and advantages of some embodiments of the invention, both as to structure and operation, will be understood and will become more readily apparent in the light of the following written description of non-limiting and non-exclusive embodiments in conjunction with the accompanying drawings, in which like reference numerals designate the same or similar parts throughout the various figures, and wherein.

DETAILED DESCRIPTION

The ensuing description provides illustrative embodiments of a method and device for counting energisation events of an energisable element.

In the present disclosure, including the ensuing description, an energisable element can include, but is not limited to, any device that can be switched/powered on and off such as a coil of an electrical relay. The element can also include other electromechanical switching devices, components, or parts. An energisation event of an energisable element can include, but is not limited to, an electrical powering on/off of the element and/or a mechanical switching on/off of the element. With respect to such an energisation event, an individual "on/off" event to be counted may be defined in various ways depending on the implementation; for example, an "on/off" event may be understood as turning on from the off state, or alternatively as turning off from the on state, or alternatively as turning on from the off state and then turning off from the on state, though the on/off event counts for such different definitions of "on/off" will, of course, be directly related. In other words, with respect to counting an energisation event, an energisation event is not limited to applying power to the energisable element, but may additionally or alternatively include disconnecting power from the energisable element, and either or both of these events (or some other combination thereof, such as energising/de-energising/energising) may be accounted for in incrementing the count.

The terms "coupled" or "connected" as used in this description are intended to cover both directly connected or connected through one or more intermediate means, unless otherwise stated.

The description herein may be, in certain portions, explicitly or implicitly described as algorithms and/or functional operations that operate on data within a computer memory or an electronic circuit. These algorithmic descriptions and/or functional operations are usually used by those skilled in the information/data processing arts for efficient description. An algorithm is generally related to a self-consistent sequence of steps leading to a desired result. The algorithmic steps can include physical manipulations of physical quantities, such as electrical, magnetic or optical signals capable of being stored, transmitted, transferred, combined, compared, and otherwise manipulated.

Further, unless specifically stated otherwise, and as would ordinarily be apparent from the following, a person skilled in the art will appreciate that throughout the present specification, discussions utilizing terms such as "scanning", "calculating", "determining", "replacing", "generating", "initializing", "outputting", and the like, refer to action and processes of an instructing processor/computer system (e.g., one or more program-controlled processors), or similar electronic circuit/device/component, that manipulates/processes and transforms data represented as physical quantities within the described system into other data similarly represented as physical quantities within the system or other information storage, transmission or display devices etc.

The present description also discloses relevant device/apparatus for performing the steps of the described methods. Such apparatus may be specifically constructed for the purposes of the methods, or may comprise a general purpose computer/processor or other device selectively activated or reconfigured by a computer program stored in a storage member. The algorithms and displays described herein are not inherently related to any particular computer or other apparatus. It is understood that general purpose devices/machines may be used in accordance with the teachings herein. Alternatively, the construction of a specialized device/apparatus to perform the method steps may be desired.

In addition, it is submitted that the description also implicitly covers a computer program in that it would be clear that the steps of the methods described herein may be put into effect by computer code. It will be appreciated that a large variety of programming languages and coding can be used to implement the teachings of the description herein. Moreover, the computer program if applicable is not limited to any particular control flow and can use different control flows without departing from the scope of the invention.

Furthermore, one or more of the steps of the computer program, if applicable, may be performed in parallel and/or sequentially. Such a computer program, if applicable, may be stored on any computer readable medium (e.g., at least one non-transitory computer readable medium). The computer readable medium may include any combination of one or more storage devices (e.g., storage members) such as magnetic or optical disks, memory chips, or other storage devices suitable for interfacing with a suitable reader/general purpose computer. The computer readable medium may even be implemented as or include a wired medium such as exemplified in the Internet system, or wireless medium such as exemplified in bluetooth technology. The computer program when loaded and executed on a suitable reader effectively results in an apparatus that can implement the steps of the described methods.

The illustrative embodiments may also be implemented as hardware modules. A module is a functional hardware unit designed for use with other components or modules. For example, a module may be implemented using digital or discrete electronic components, or it can form a portion of an entire electronic circuit such as an Application Specific Integrated Circuit (ASIC). A person skilled in the art will understand that the illustrative embodiments can also be implemented as a combination of hardware and software modules.

Figure 1A:
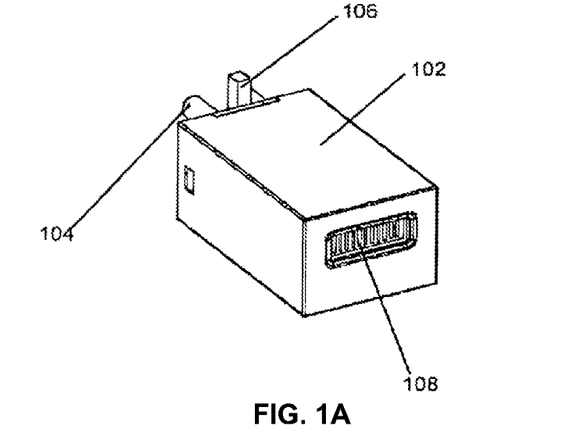
FIG. 1(a) shows a device for counting energisable events according to an illustrative embodiment of the present disclosure.

FIG. 1(a) shows a device 102 for counting energisable events in accordance with an illustrative embodiment of the present disclosure. The device 102 comprises at least one connector member 104 for connecting to an energisable element. The device 102 also comprises a docking member 106 for facilitating efficient connection to an energisable element. The device 102 further comprises a display 108 for displaying information indicative of a usability of an energisable element. In the illustrative embodiment, the usability is determined based on a counted number of energisation events of the energisable element.

Figure 1B:
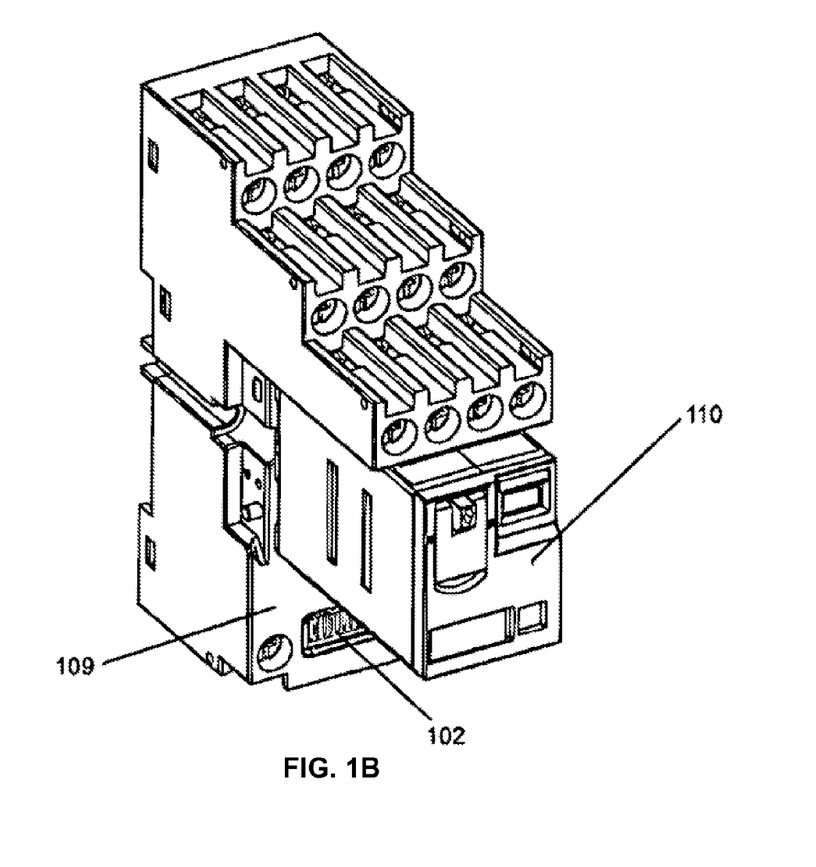
FIG. 1(b) shows a device for counting energisable events integrally connected to a socket coupled to an energisable element, in accordance with an illustrative embodiment of the present disclosure.

FIG. 1(b) shows the device 102 integrally connected to a socket 109 coupled to an energisable element 110, in accordance with an illustrative embodiment. The energisable element 110 can be, for example, a relay.

Figure 2:
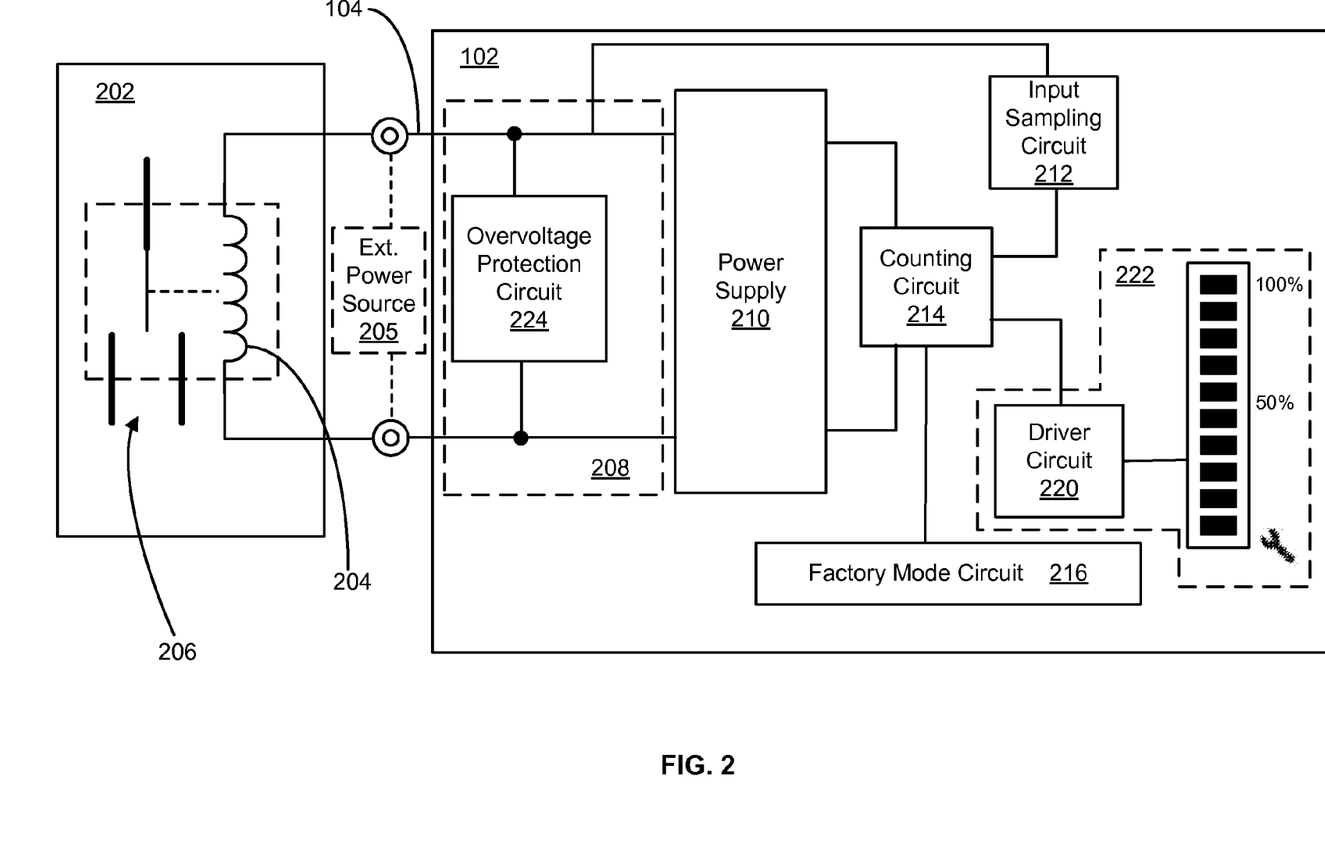
FIG. 2 is a schematic diagram illustrating a device for counting energisable events in electrical connection with a relay, in accordance with an illustrative embodiment of the present disclosure.

FIG. 2 is a schematic diagram illustrating the device 102 in electrical connection with a relay 202, in accordance with an illustrative embodiment. In this illustrative embodiment, the device 102 is connected to the relay 202 using connector members 104 and, by way of example, the relay 202 is an electro-mechanical relay. In the illustrative embodiment, the connector members 104 are used to detect energisation of a relay coil 204. It will be appreciated, however, that detection of energisation events is not limited to detection of powering on/off of the relay coil and can alternatively or additionally include, for example, detection of switching on/off of the relay 202 mechanical contacts 206. In the illustrative embodiment, the connector members 104 can take the form of a plug which can be inserted into a socket of the relay 202.

In the illustrative embodiment, the relay coil 204 functions similar to an inductor. Due to this characteristic, if an external power supply 205 is available, the relay coil 204 is energized and energy is stored in the relay coil 204. If the power supply 205 is cut off, the energy is released to the device 102. The mechanical contacts 206 are controlled to switch to different positions depending on whether the relay coil 204 is energized or is de-energized.

In this illustrative embodiment, the device 102 comprises a protection module 208 coupled to a power supply module 210, the power supply module 210 for powering various components of the device 102; a sampling module 212 in connection with the connector members 104; a count module 214 coupled to the sampling module 212; a reset module 216 coupled to the count module 214; and a display module 218 coupled to the count module 214.

In the illustrative embodiment, in use, the sampling module 212 detects an electrical powering on/off of the relay coil 204; e.g., the availability of a power supply 205 being provided to the relay coil 204. It will be appreciated that the power supply may be either an alternating current (AC) or direct current (DC) power source externally connected to the leads of the relay 202. That is, the relay coil 204 is energised/powered on when the power source is connected to it, thus causing the mechanical contacts 206 to be in a first state (e.g., closed); and the relay coil 204 is de-energised/ powered off when the power source is disconnected from it, thus causing the mechanical contacts 206 to be in a second state (e.g., open). In the illustrative embodiment, each time the relay coil is powered on, a triggering signal is generated in the sampling module 212. The sampling module 212 can be in the form of an input sampling circuit that comprises a resistor; or a combination of a resistor, a transistor, a capacitor and/or a zener diode.

The count module 214 receives input from the sampling module 212 and maintains a count on the number of times the relay coil 204 has been powered on/off. The count module 214 counts the number of triggering signals sent from the sampling module 212. For example, one energisation event is counted based on a detection of a switch coupled to the relay coil 204 being switched on. In the illustrative embodiment, the count module 214 processes and transmits the number information to the display module 218. The number information is related to the usability of the relay coil 204. For example, a supplier of the relay 202 may have estimated a maximum number of times the relay coil may be switched on before it approaches failure and/or should be replaced. This is also known as the life cycle of the relay 202. The number information may be in the form representing the number of times the relay coil has been energised relative to the estimated maximum number of times; for example, as a percentage-used information. The number information may also be in the form of the estimated remaining life cycle based on subtracting the number of times the relay coil has been energised from the estimated maximum number of times.

The count module 214 can be in the form of a counting circuit that comprises a microcontroller or a microprocessor or a programmable logic device with supporting electronics components such as a crystal or an oscillator with reset capabilities.

The display module 218 receives the number information from the count module 214 and displays information relating to the usability of the relay coil 204.

Figure 3A:
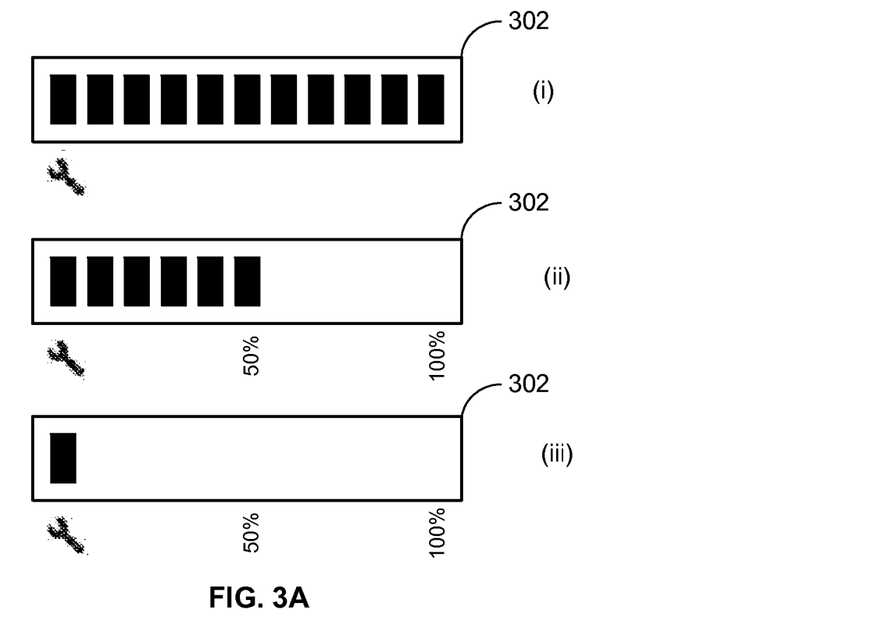
FIG. 3(a) is a schematic illustration of a display displaying usability of a relay coil, in accordance with an illustrative embodiment of the present disclosure.

FIG. 3(a) is a schematic illustration of a display displaying usability of a relay coil in accordance with an illustrative embodiment. As shown, in this example, the display is in the form of a progress bar. When the relay coil is unused and/or new, at portion (i), the display 302 shows that the remaining life cycle of the relay coil is 100%. When the relay is used until 50% of its estimated life cycle, at portion (ii), the display 302 shows that the remaining life cycle of the relay coil is 50%. When the relay is used until expiry of its estimated life cycle, at portion (iii), the display 302 shows that the relay should be replaced and/or it is the time for carrying out maintenance works.

Figure 3B:
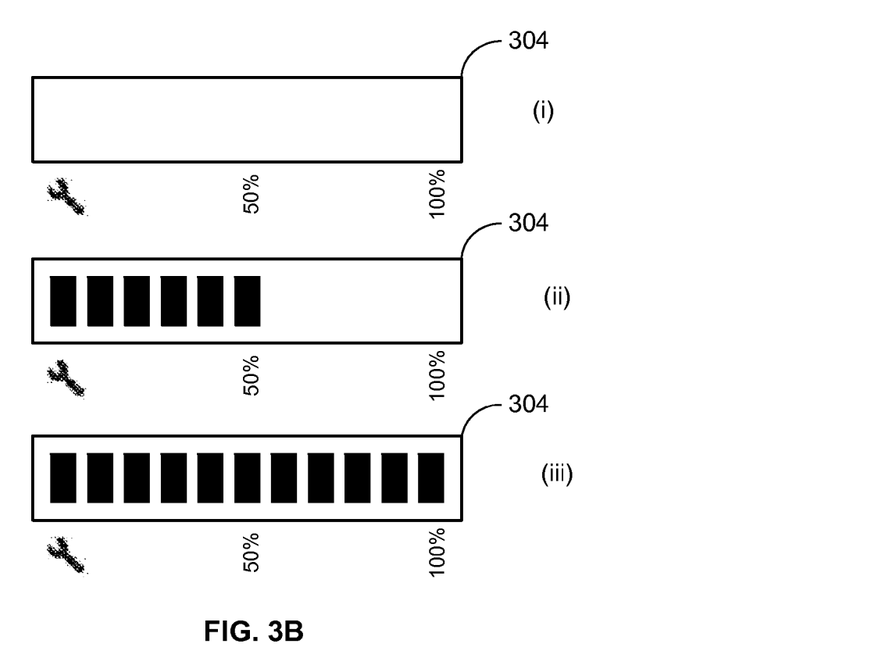
FIG. 3(b) is a schematic illustration of a display displaying usability of a relay coil, in accordance with an illustrative embodiment of the present disclosure.

FIG. 3(b) is a schematic illustration of a display displaying usability of a relay coil in another illustrative embodiment. The display is in the form of a usage bar. When the relay coil is unused and/or new, at portion (i), the display 304 shows that the relay coil is 0% used of its estimated maximum number of times it is switched on. When the relay is used until 50% of its estimated life cycle, at portion (ii), the display 304 shows that the relay coil is 50% used of its estimated maximum number of times. When the relay is used until expiry of its estimated life cycle, at portion (iii), the display 304 shows that the relay coil is 100% used of its estimated maximum number of times and should be replaced, and/or it is the time for carrying out maintenance works.

Returning to FIG. 2, in the illustrative embodiment, the display module 218 may be implemented as a display that is capable of displaying information with little or no power supply to power the display. That is, a bistable display may be used that can display information even in the absence of power supply to power the display. This can provide a so-called e-paper display to the device 102. The bistable display can include, but is not limited to, an electrophoretic display, an electrowetting display, an electrofluidic display etc.

In the illustrative embodiment, the display module 218 comprises a driver circuit 220 and a bistable display 222 coupled to the driver circuit 220. The driver circuit 220 is in turn coupled to the count module 214. The driver circuit 220 comprises an integrated circuit and functions to process/ translate the number information from the count module 214 in order to instruct the bistable display 222 to display information relating to usability of the relay coil 204.

Figure 4:
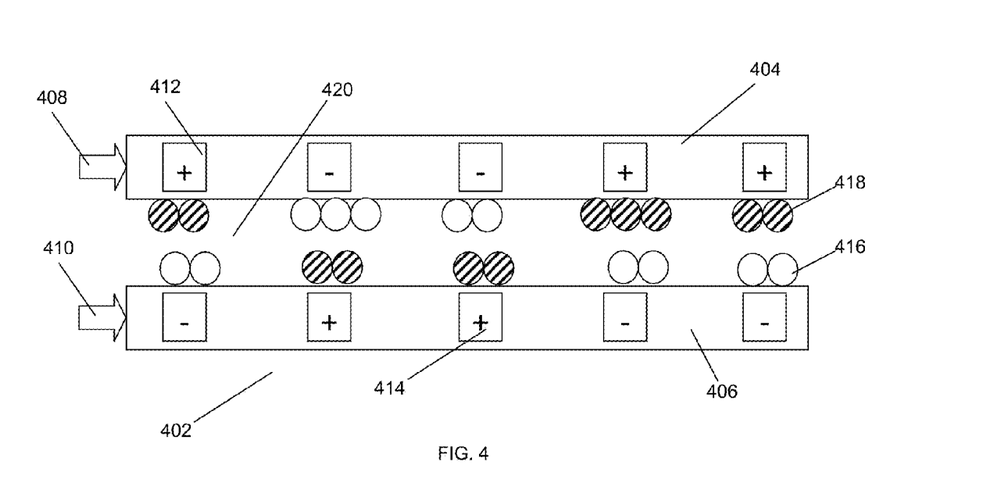
FIG. 4 is a schematic diagram of a bistable display, in accordance with an illustrative embodiment of the present disclosure.

FIG. 4 is a schematic diagram of a bistable display 402 in an illustrative implementation. The bistable display 402 comprises an upper transparent electrode layer 404 and a lower electrode layer 406. The upper transparent electrode layer 404 faces a user of the display 402. The electrode layers 404, 406 are driven by a driver circuit (not shown) via driving means, e.g., 408, 410 to provide polarity to pixels, e.g., 412, 414 (by voltage application). The bistable display 402 further comprises a plurality of charged pigment particles/microcapsules, e.g., 416, 418 suspended/held in a layer of, e.g., liquid polymer/oil 420. In the schematic diagram, shaded particles/microcapsules, e.g., 418 that hold negative charges are attracted to pixels that hold positive charges. Thus, by controlling the polarity of each pixel, the display 402 can be manipulated to display information.

Thus, by using a bistable display, even in the absence of a power supply, the polarity to the pixels can be retained over a period of time and therefore, the particles/microcapsules, e.g., 416, 418 can continue to display desired information in the absence of a power supply. In any case, even if in some implementations the power supply is desired to be continuously provided to the bistable display, usage of the bistable display can also minimise power consumption, leading to a longer period of usage, since power consumption for providing polarity to the pixels is minimal.

In the illustrative embodiment, the inventors have recognised that repeated energization and de-energization of the energisation element can create transient overvoltage phenomena especially when the energisation element is in a de-energization phase. Therefore, in some implementations it may be desirable to provide the protection module 208 in the device 102, as shown in FIG. 2, for example.

Referring to the illustrative embodiment of FIG. 2, the protection module 208 comprises an overvoltage protection circuit 224.

In the illustrative embodiment, the factory mode circuit 216 is provided as a reset option to the count module 214. That is, the factory mode circuit 216 is used for resetting the counts made by the count module 214 to zero so that the device 102 may be reused for counting energisation events. This can provide cost savings since users do not have to change to a new counting device. Instead, a user can detach the device 102 from the energisation element, reset the count to zero by activating the factory mode circuit 216 and re-attach the device 102 to an energisation element. The factory mode circuit 216 may be used also for resetting counts after an energisation element has been first tested at a production line prior to putting the energisation element for sale on the market. The factory mode circuit 216 can be implemented, for example, using a resistor, or a resistor with switch.

In the illustrative embodiment, the power supply module 210 is provided to tap on the power source 205 and regulate a power supply to the various components of the device 102 such as the count module 214, the display module 218, etc.

Figure 5:
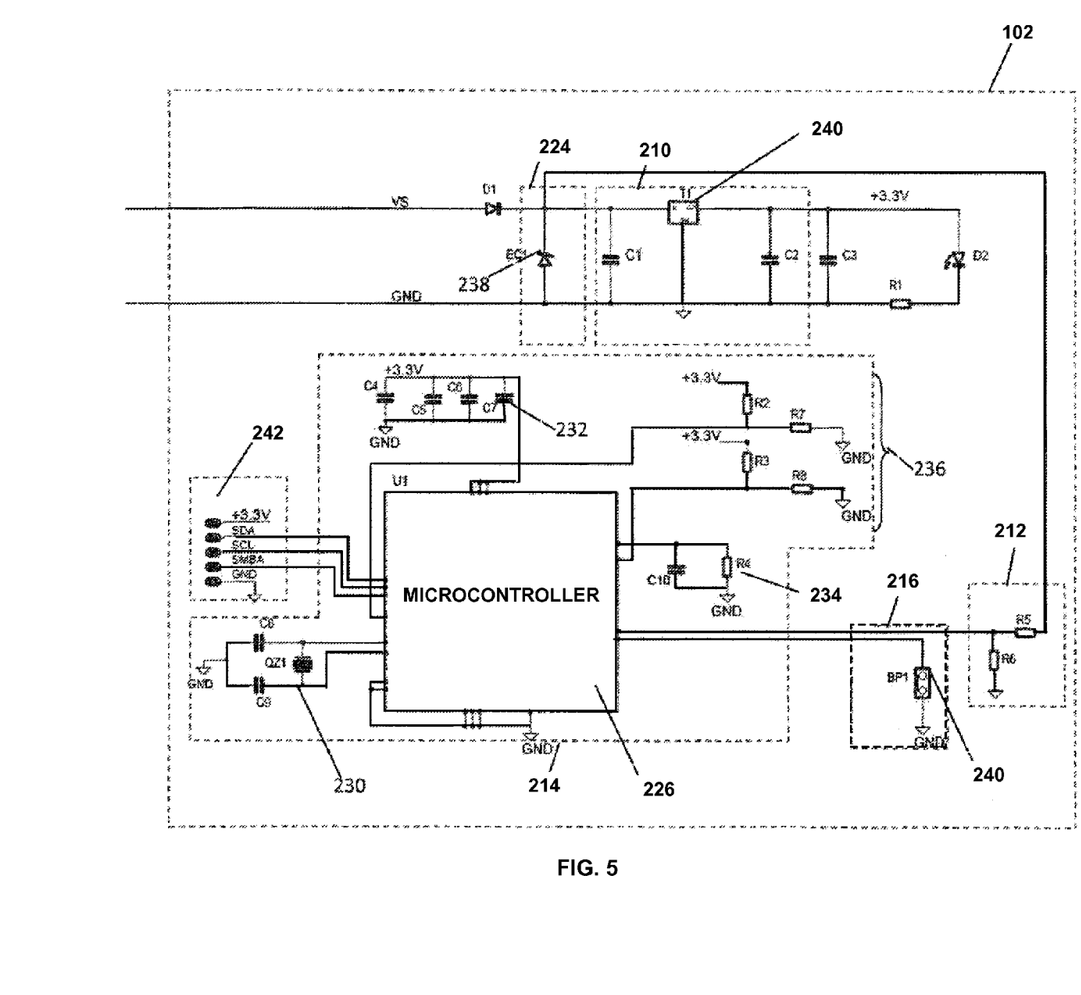
FIG. 5 is a schematic circuit diagram of a device for counting energisable events for electrical connection to a relay using a direct current (DC) power supply, in accordance with an illustrative embodiment of the present disclosure.

FIG. 5 is a schematic circuit diagram of a device for counting energisable events for electrical connection to a relay using a direct current (DC) power supply, in accordance with an illustrative embodiment. For illustration purposes only, numerals of the various modules from FIG. 2 are used in FIG. 5, but it will be appreciated that the numerals are not meant to be restrictive to the modules of FIG. 2. In other words, elements in FIG. 5 referenced by numerals corresponding to those in FIG. 2 are non-limiting, non-exclusive examples of implementations of the correspondingly numbered modules in FIG. 2.

In FIG. 5, the sampling module 212 comprises two resistors R5 and R6 functioning as a voltage divider. The voltage divider as sampling module 212 samples the availability of the power supply 205 and transmits that information to the count module 214 for processing.

The count module 214 comprises a microcontroller U1 226. U1 226 can be a controller from the STM32F100C series manufactured by STMicroelectronics. In the example shown, at numeral 230, oscillator QZ1 and capacitors C8, C9 function as a clocking circuit for U1 226. At numeral 232, capacitors C4, C5, C6, C7 function as electromagnetic compatibility (EMC) filtering for U1 226. At numeral 234, capacitor C10 and resistor R4 function as a reset circuit for U1 226. At numeral 236, resistors R2, R7, R3, R8 function as a booting selection circuit for U1 226. In the example, the count module 214 memorizes the number of high signals or binary "1" counts when the signal received from the sampling module 212 transitions from low to high, or even high to low depending on the firmware algorithm design for U1 226. Further, the count module 214 comprises an interface circuit 242 for interfacing to the display module 218.

In FIG. 5, for the overvoltage protection circuit 224, a voltage suppressing component EC1 238 is provided. EC1 238 functions to suppress overvoltage phenomena created by the external power source 205 connecting on/off to the relay 202. As FIG. 5 is shown to illustrate a DC power supply, EC1 238 can be a transient voltage suppression (TVS) diode known as Transil. In this example, EC1 238 can clamp voltage characteristics of about 30V. In this case, when the overvoltage occurs and exceeding 30V, the overvoltage is clamped at about 30V and the overvoltage current is by-passed through EC1 238, thus preventing current flow into the rest of the modules of the device 102.

It has been recognised by the inventors that transient overvoltage can occur, e.g., in the power source 205 or during a de-energization cycle of the coil 204. The protection module 208 can clamp the overvoltage at a pre-determined voltage level and can by-pass the transient current resulting from the transient voltage back to the power source 205. Thus, the transient current resulting from the transient overvoltage can be advantageously prevented from entering and damaging the various components of the device 102.

It will be appreciated that if the power supply is an alternating current (AC) supply, EC1 238 can be a voltage dependent resistor or varistor. If the power supply is both AC and DC, a varistor can also be used. Other components such as resistors, diodes, zener diodes and/or capacitors can also be used in combination with varistors and/or Transils to obtain the protection described above.

In FIG. 5, the factory mode circuit 216 comprises a switch BP1 240. BP1 240 provides a high signal or a low signal corresponding to whether BP1 240 is actuated or de-actuated respectively. In this example, if BP1 240 is actuated for more than about 5 seconds, the count module 214 (e.g. through U1 226) can sense this actuation duration and erase/reset all previous memorized counting information (e.g., through a reset pin of the U1 226).

In FIG. 5, the power supply module 210 comprises a voltage supply regulator T1 240. T1 240 functions to regulate power supply from the external power source 205 for supplying to other components of the relay 102. In this example, T1 240 is a linear regulator given that the power supply is a DC supply.

It will be appreciated that for a scenario whereby the external power source 205 is an alternating current (AC) power source, the power supply module 210 can take on various forms including being a transformer, a switched mode power supply, a limiting impedance circuit or a linear voltage step-down circuit. The power supply module 210, in this case of an external AC power source, is for stepping down the voltage of the external power source 205 to a lower voltage for powering the operations of the device 102.

Figure 6A:
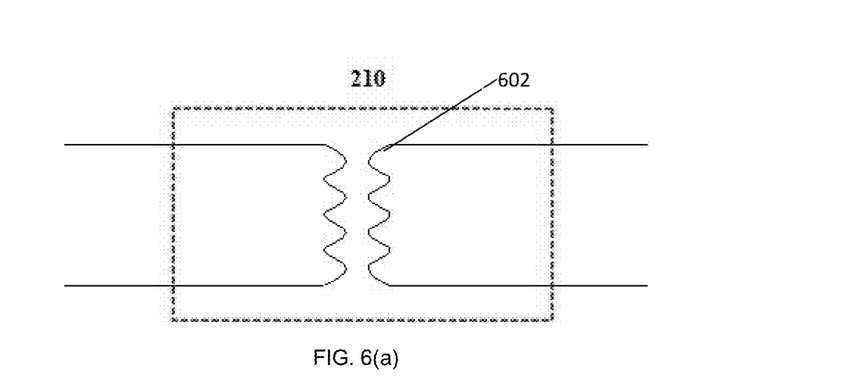
FIG. 6(a) is a schematic diagram illustrating a power supply module for connection to an external alternating current (AC) power supply, in accordance with an illustrative embodiment of the present disclosure.

FIG. 6(a) is a schematic diagram illustrating a power supply module for connection to an external alternating current (AC) power supply in an illustrative embodiment. In this example, the power supply module 210 is a transformer 602.

Figure 6B:
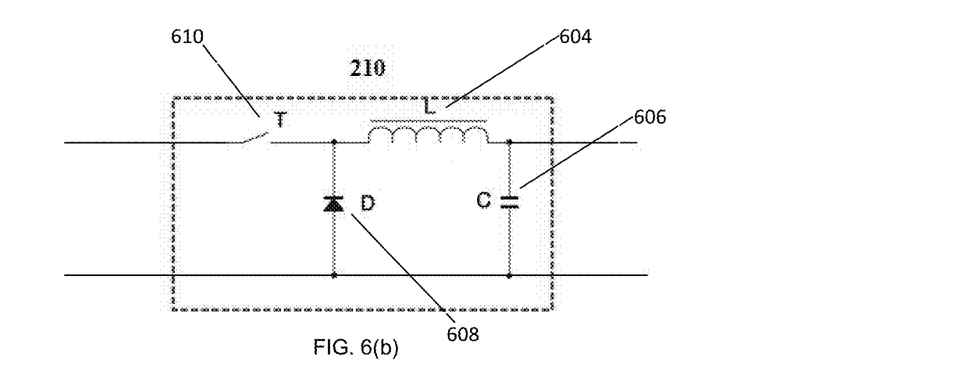
FIG. 6(b) is a schematic diagram illustrating another power supply module for connection to an external alternating current (AC) power supply, in accordance with an illustrative embodiment of the present disclosure.

FIG. 6(b) is a schematic diagram illustrating another power supply module for connection to an external alternating current (AC) power supply in an illustrative embodiment. In this example, the power supply module 210 is a switched mode power supply that comprises an inductor element 604, a capacitor 606, a diode 608 and a switch 610.

Figure 6C:
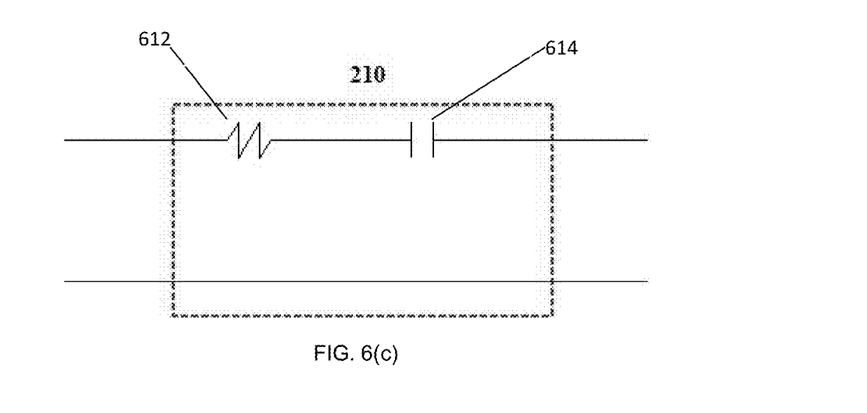
FIG. 6(c) is a schematic diagram illustrating another power supply module for connection to an external alternating current (AC) power supply, in accordance with an illustrative embodiment of the present disclosure.

FIG. 6(c) is a schematic diagram illustrating another power supply module for connection to an external alternating current (AC) power supply in an illustrative embodiment. In this example, the power supply module 210 is a limiting impedance circuit that comprises a resistor element 612 and a capacitor 614.

Figure 6D:
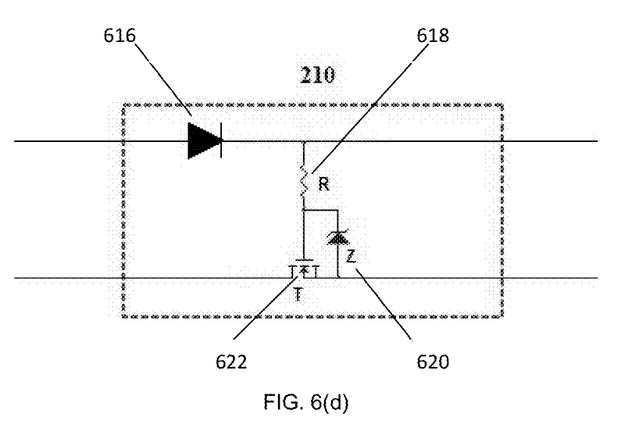
FIG. 6(d) is a schematic diagram illustrating another power supply module for connection to an external alternating current (AC) power supply, in accordance with an illustrative embodiment of the present disclosure.

FIG. 6(d) is a schematic diagram illustrating another power supply module for connection to an external alternating current (AC) power supply in an illustrative embodiment. In this example, the power supply module 210 is a linear voltage step-down circuit that comprises a diode 616, a resistor 618, a zener diode 620 and a transistor element 622.

Figure 7:
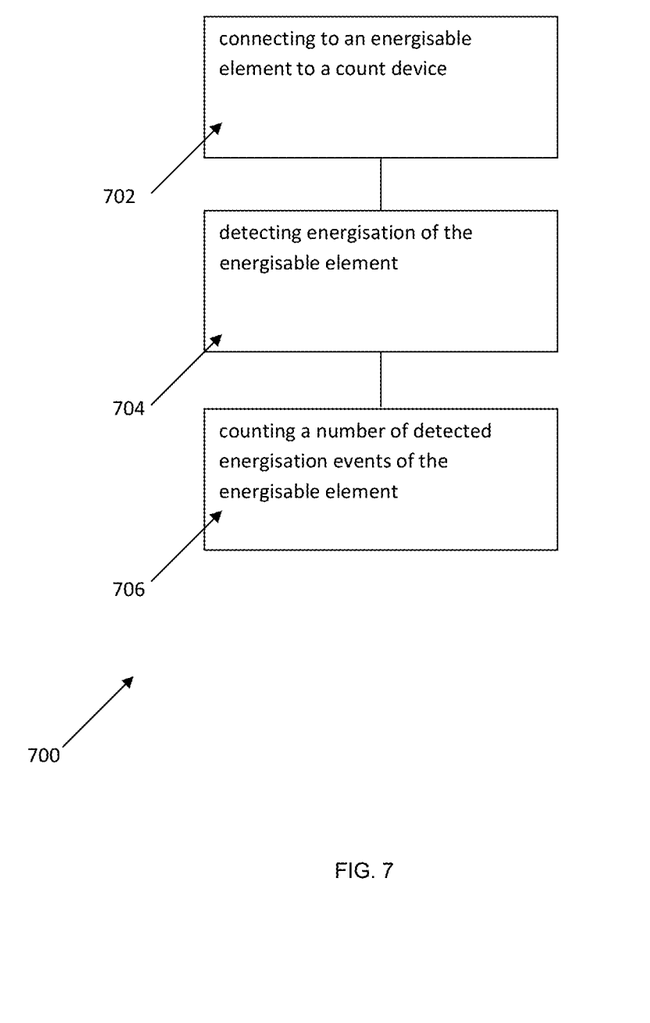
FIG. 7 is a schematic flowchart illustrating a method of counting energisation events, in accordance with an illustrative embodiment of the present disclosure.

FIG. 7 is a schematic flowchart illustrating a method of counting energisation events in an illustrative embodiment. At step 702, an energisable element is connected to a count device. At step 704, energisation of the energisable element is detected. At step 706, a number of detected energisation events of the energisable element is counted.

The above described illustrative embodiments can advantageously provide information relating to the usability of an energisable element. This can provide early warning to users before the energisable element reaches the end of its lifecycle. This can also reduce unnecessary replacement of devices comprising the energisable element. The information can also help to ensure that machines or equipment utilising the energisable element are working at their optimum conditions. Maintenance work can thus be made simpler and cheaper. The above described illustrative embodiments, when utilising a bistable display, can also provide cost savings as power requirements can be reduced, given that the display can display count information in the absence of power supply. That is, using a bistable display can advantageously reduce loss of information even when there is a power disruption to the count device or system. Hence, the count information can remain displayed on the bistable display even when no power is supplied to the display. It will be understood, however, that the present invention may be practiced without necessarily providing one or more of the advantages described herein or otherwise understood in view of the disclosure and/or that may be realized in some embodiments thereof.

In the illustrative embodiments, the device for counting energisable events of an energisable element may be integrally attached to a socket that is coupled to the energisable element. Alternatively, the device for counting energisable events can be integrally attached directly to the energisable element of an electrical device or relay. As yet another illustrative alternative, the device for counting energisable events may also be detachably attached to the energisable element of an electrical device.

The display module is not limited to providing a bistable display but can include other display means such as a liquid crystal display, a light-emitting diode display, etc.

In the illustrative embodiments, the count information can be displayed on a display that is coupled to the device for counting energisable events. However, the illustrative embodiments are not limited as such and can include implementing, e.g., a storage member, such as a memory chip/stick in communication with the count module, to store the count information. In such an instance, the count information can be read from the storage member when desired.

Additionally, it will be appreciated by a person skilled in the art that numerous variations and/or modifications may be made to the specific embodiments disclosed herein without departing from the scope of the invention as broadly described. The presently disclosed embodiments are, therefore, to be considered in all respects to be illustrative and not restrictive. It is, therefore, intended that the present invention is not limited to the disclosed embodiments but should be defined in accordance with the claims that follow.

What is claimed is:

1. A device for counting energisation events, the device comprising:
   a connector configured to be connected to an energisable element;
   a sampling module coupled to the connector, the sampling module configured to detect a signal representing an energisation event of the energisable element;
   a count module coupled to the sampling module, the count module configured to count a number of detected energisation events of the energisable element; and
   a display module coupled to the count module and configured to, while the display module is coupled to the count module, display information relating to a usability of the energisable element based on the counted number of detected energisation events, wherein the display module comprises a bistable display, wherein said information relating to a usability of the energisable element is arranged to be displayed on the bistable display, and the bistable display is capable of displaying said information in the absence of power supply to power the display.

2. The device as claimed in claim 1, wherein one energisation event is counted based on a detection of a switch coupled to the energisable element being switched on.

3. The device as claimed in claim 1, wherein the energisable element is a coil of a relay.

4. The device as claimed in claim 3, wherein the energisation event of the coil is caused by connection of a power supply to the coil.

5. The device as claimed in claim 1, wherein the information relating to a usability of the energisable element is based on an estimated maximum number of energisation events.

6. The device as claimed in claim 1, wherein the information relating to a usability of the energisable element is based on an estimated remaining life of the energisable element.

7. A method of counting energisation events, the method comprising:
   connecting a count device to an energisable element;
   detecting a signal representing an energisation event of the energisable element;
   counting a number of detected energisation events of the energisable element; and
   displaying on a bistable display, while the bistable display is coupled to the counting device, information relating to a usability of the energisable element based on the counted number of detected energisation events, wherein the bistable display is capable of displaying said information in the absence of power supply to power the display.

8. The method as claimed in claim 7, wherein the number of energisation events is incremented by one based on each respective occurrence of the detected signal being indicative of a switch coupled to the energisable element being switched on.

9. The method as claimed in claim 8, wherein the energisable element is a coil of a relay.

10. The method as claimed in claim 9, wherein the energisation event of the coil is caused by connection of a power supply to the coil.

11. The method as claimed in claim 7, wherein the information relating to a usability of the energisable element is based on an estimated maximum number of energisation events.

12. The method as claimed in claim 7, wherein the information relating to a usability of the energisable element is based on an estimated remaining life of the energisable element.

13. A system for counting energisation events, the system comprising:
   an energisable element;
   a device for counting energisation events, the device being connected to the energisable element;
   the device further comprising:
      a sampling module configured to detect a signal representing an energisation event of the energisable element; and
      a count module coupled to the sampling module, the count module being configured to count a number of detected energisation events of the energisable element; and
      a display module coupled to the count module and configured to, while the display module is coupled to the count module, display information relating to a usability of the energisable element based on the counted number of detected energisation events, wherein the display module comprises a bistable display, wherein said information relating to a usability of the energisable element is arranged to be displayed on the bistable display, and the bistable display is capable of displaying said information in the absence of power supply to power the display.

14. The system as claimed in claim 13, wherein the device is detachably connected to the energisable element.

15. The system as claimed in claim 13, wherein the device is integrally connected to the energisable element.

16. The system as claimed in claim 13, wherein one energisation event is counted based on a detection of a switch coupled to the energisable element being switched on.

17. The system as claimed in claim 13, wherein the energisable element is a coil of a relay.

18. The system as claimed in claim 17, wherein the energisation event of the coil is caused by connection of a power supply to the coil.

19. The system as claimed in claim 13, wherein the information relating to a usability of the energisable element is based on an estimated maximum number of energisation events.

20. The system as claimed in claim 13, wherein the information relating to a usability of the energisable element is based on an estimated remaining life of the energisable element.

* * * * *